United States Patent [19]

Kakumaru et al.

[11] Patent Number: 5,045,433
[45] Date of Patent: Sep. 3, 1991

[54] SUBSTITUTED ACRIDINE DERIVATIVES AND APPLICATION THEREOF

[75] Inventors: Hajime Kakumaru; Yoshitaka Minami, both of Hitachi; Naohiro Kubota; Shinya Mashimo, both of Urawa, all of Japan

[73] Assignees: Hitachi Chemical Co., Ltd.; Adeka Argus Chemical Co., Ltd., both of Tokyo, Japan

[21] Appl. No.: 529,707

[22] Filed: May 30, 1990

Related U.S. Application Data

[62] Division of Ser. No. 269,147, filed as PCT JP88/00275 on Mar. 17, 1988, published as WO88/07042 on Sep. 22, 1988, abandoned.

[30] Foreign Application Priority Data

Mar. 17, 1987 [JP] Japan .................................. 62-62209
Apr. 14, 1987 [JP] Japan .................................. 62-91725

[51] Int. Cl.$^5$ .............................................. G03F 7/031
[52] U.S. Cl. ..................................... 430/281; 430/920; 522/63; 522/26
[58] Field of Search ................... 430/281, 920; 522/63, 522/26

[56] References Cited

U.S. PATENT DOCUMENTS

| | | | |
|---|---|---|---|
| 3,649,632 | 3/1972 | Diebold et al. | 546/104 X |
| 3,751,259 | 8/1973 | Bauer et al. | 522/63 X |
| 3,930,865 | 1/1976 | Faust et al. | 430/281 X |
| 4,587,200 | 5/1986 | Tamoto et al. | 522/26 X |
| 4,705,740 | 11/1987 | Geissler et al. | 430/281 X |

FOREIGN PATENT DOCUMENTS

| | | |
|---|---|---|
| 0103218 | 3/1984 | European Pat. Off. |
| WO88/07042 | 9/1988 | PCT Int'l Appl. |
| 1168562 | 7/1985 | U.S.S.R. ............................ 546/104 |

OTHER PUBLICATIONS

Cook et al., Chemical Abstracts, vol. 38:105$^6$–105$^9$ (1944).

Zeng et al., Tetrahedron Letters, vol. 29, No. 40, pp. 5123–5124 (1988).
Chemical Abstracts, Eighth Collective Index, vol. 66–75 formulas C19–C22, 1967–1971, p. 854F, Columbus, Ohio.
Chemical Abstracts, vol. 72, No. 25, 6/22/70, p. 340, Abstract No. 132479j, Columbus, Ohio, U.S. A. K. Sheinkman, et al., "Reactions of cyclammonium cations. VII. Reaction of acridine with activated aromatic compounds in the . . ."

*Primary Examiner*—Cynthia Hamilton
*Attorney, Agent, or Firm*—Antonelli, Terry, Stout & Kraus

[57] ABSTRACT

A substituted acridine derivative represented by

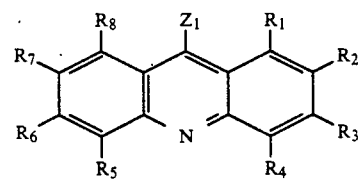

wherein $R_1$, $R_2$, $R_3$, $R_4$, $R_5$, $R_6$, $R_7$ and $R_8$ are independently hydrogen atoms, alkyl groups, substituted alkyl groups, aryl groups, substituted aryl groups, halogen atoms, or alkoxy groups, and $Z_1$ is a six-membered heteroaromatic group which has one or two nitrogen atoms in its ring and may have an alkyl substituent having 1 to 8 carbon atoms, or a quinolyl group; and a photopolymerizable composition comprising 0.01 to 10 parts by weight of said derivative, 100 parts by weight of a photopolymerizable compound having a boiling point of 100° C. or higher at atmospheric pressure and at least one kind of ethylenic unsaturated group, and 0 to 400 parts by weight of a thermoplastic organic polymer.

3 Claims, No Drawings

SUBSTITUTED ACRIDINE DERIVATIVES AND APPLICATION THEREOF

This application is a Divisional of application Ser. No. 269,147 filed as PCT JP88/00275 on Mar. 17, 1988, published as WO88/07042 on Sept. 22, 1988, now abandoned.

TECHNICAL FIELD

This invention relates to an acridine derivative substituted in the 9-position by a six-membered heterocyclic ring or a quinolyl group which is useful as a photopolymerization initiator, and a photopolymerizable composition having a high photosensitivity which contains this compound as a photopolymerization initiator.

BACKGROUND ART

It is known that an unsaturated monomer or an unsaturated polymer (prepolymer) is placed together with a suitable photopolymerization initiator and polymerized by light irradiation. Such photopolymerizable compositions are used in various fields, for example, in lithographic, relief or intaglio printing plates, light-curable inks, coating materials, photoresists for printed circuit boards, adhesives, etc.

Particularly in some applications, reduction of the time of exposure to actinic rays is required, and for this purpose, various attempts have heretofore been made to increase the polymerization rate of a photopolymerizable composition, namely, to increase its photosensitivity.

For example, a method comprising adding a photopolymerization initiator or a sensitizer to a photopolymerizable composition containing an ethylenic unsaturated group containing compound is employed for increasing the photosensitivity. As the photopolymerization initiator or the sensitizer, there are used, for example, polynuclear quinones such as 2-ethylanthraquinone, 2-t-butylanthraquinone, etc.; aromatic ketones such as benzophenone, 4,4'-bis(dimethylamino)benzophenone, etc.; and benzoin derivatives such as benzoin methyl ether, benzoin ethyl ether, etc.

However, these aromatic compounds are disadvantageous in that they cause coloring of cured products and also in that since they are not sufficiently effective, light irradiation for a long period of time is required. Therefore, they have not been satisfactory for practical purposes.

In order to increase the photosensitivity, there have been disclosed employment of a combination of an aromatic ketone such as aminophenyl ketone and a 2,4,5-triarylimidazole dimer (Japanese Patent Publication No. 48-38403 and U.S. Pat. No. 731,733) and employment of a combination of aminophenyl ketone and an active methylene compound or an amino compound (Japanese Patent Publication No. 49-11936 and U.S. Pat. No. 877,853), but they are still not satisfactory.

On the other hand, 9-substituted acridine compounds are proposed as highly photosensitive compounds in Jap. Pat. Appln. Kokai (Laid-Open) No. 47-4126, but are not sufficiently effective. Acridine or phenazine compounds which can contain a fused benzole ring are disclosed in Japanese Patent Publication No. 53-27605 as photopolymerization initiators which have high sensitivity and storage stability particularly in the presence of oxygen, but these compounds are still not satisfactory.

A combination of 9-phenylacridine and a thiol group containing heterocyclic compound is disclosed as a highly sensitive photopolymerization initiator. But, the above combination does not bring about a sufficient improving effect.

Substituted 9-benzoylacridines are disclosed as highly sensitive photopolymerization initiators in Jap. Pat. Appln. Kokai (Laid-Open) No. 60-164739.

At present, however, no photopolymerizable composition having a sufficient photosensitivity can be obtained even by use of the compounds described above.

DISCLOSURE OF THE INVENTION

One aspect of the invention is directed to an acridine derivative substituted in the 9-position by a six-membered heterocyclic ring or a quinolyl group which is useful as a photopolymerization initiator having a sufficient photosensitivity even when used alone.

That is to say, the present inventors found that an acridine derivative represented by the general formula [I]:

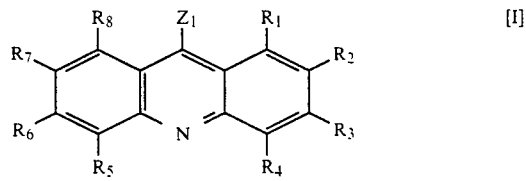

wherein $R_1$, $R_2$, $R_3$, $R_4$, $R_5$, $R_6$, $R_7$ and $R_8$ are independently hydrogen atoms, alkyl groups, substituted alkyl groups, aryl groups, substituted aryl groups, halogen atoms or alkoxy groups, and $Z_1$ is a six-membered heteroaromatic group which has one or two nitrogen atoms in its ring and may have an alkyl substituent having 1 to 8 carbon atoms, or a quinolyl group, was very effective as a photorization initiator, permitted progress of polymerization to a required degree by light irradiation for a short time, and did not cause coloration of a polymer. Furthermore, the present inventors found that a photopolymerizable composition containing the derivative of the above general formula [I] as a photopolymerization initiator had an excellent storage stability and was advantageous also in that it did not change in properties even when stored for a long period of time.

Another aspect of the invention is directed to a novel photopolymerizable composition excellent in photosensitivity which is free from the above-mentioned defects of the prior arts.

That is to say, the present inventors found that the above object could be achieved by using as photopolymerization initiator an acridine derivative having a specific heteroaromatic group as a substituent, in a composition containing a compound having an ethylenic unsaturated group, whereby this invention has been accomplished.

In detail, this invention relates to a photopolymerizable composition comprising (1) 100 parts by weight of a photopolymerizable compound which has a boiling point of 100° C. or higher at atmospheric pressure and has at least one kind of ethylenic unsaturated group, (2) 0 to 400 parts by weight of a thermoplastic organic polymer, and (3) 0.01 to 10 parts by weight of a photopolymerization initiator, said photopolymerication initiator being the substituted acridine derivative of the above general formula [I].

BEST MODE FOR CARRYING OUT THE INVENTION

The substituted acridine derivative of the general formula [I]:

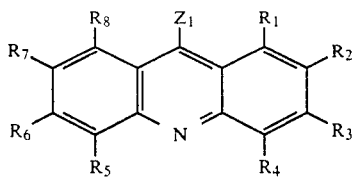

wherein $R_1$, $R_2$, $R_3$, $R_4$, $R_5$, $R_6$, $R_7$ and $R_8$ are independently hydrogen atoms, alkyl groups, substituted alkyl groups, aryl groups, substituted aryl groups, halogen atoms or alkoxy groups, and $Z_1$ is a six-membered heteroaromatic group which has one or two nitrogen atoms in its ring and may have an alkyl substituent having 1 to 8 carbon atoms, or a quinolyl group, can easily be produced, for example, by reacting a diphenylamine which may have a substituent in its phenyl ring with an aromatic dicarboyxlic acid having the above-mentioned six-membered heterocyclic ring in the presence of a polyphosphoric acid.

When all of the substituents $R_1$, $R_2$, $R_3$, $R_4$, $R_5$, $R_6$, $R_7$ and $R_8$ are alkyl groups in the substituted acridine derivative of the above general formula [I], they are preferably alkyl groups having 1 to 8 carbon atoms. The alkyl groups are optionally substituted by halogen atoms, alkoxy groups having 1 to 8 carbon atoms, etc. When the substituted acridine compound has a substituted aryl group, the substituent on the substituted aryl group is an alkyl group having 1 to 8 carbon atoms, an alkoxy group having 1 to 8 carbon atoms, a halogen atom, or the like. The six-membered heteroaromatic group for $Z_1$ in the above general formula [I] is preferably a pyridyl group, a pyrimidinyl group or a pyrazinyl group, which may have an alkyl substituent having 1 to 8 carbon atoms, and it includes, for example, pyridyl group, 5-methylpyridyl group, 5-ethylpyridyl group, 5-butylpyridyl group, pyrimidinyl group, pyrazinyl group and 5-methylpyrazinyl group. Particularly preferable are 9-pyridylacridine compounds represented by the above general formula [I] in which all of $R_1$, $R_2$, $R_3$, $R_4$, $R_5$, $R_6$, $R_7$ and $R_8$ are hydrogen atoms and $Z_1$ is a pyridyl group, namely, the one represented by the following formula [II]:

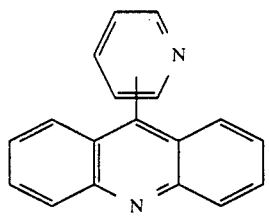

The substituted acridine compound of the above general formula [I] includes 9-(2-pyridyl)acridine, 9-(3-pyridyl)acridine, 9-(4-pyridyl)acridine, 9-(4-pyrimidinyl)acridine, 9-(2-pyrazinyl)acridine, 9-(5-methyl-2-pyrazinyl)acridine, 9-(2-quinolinyl)acridine, 9-(2-pyridyl)-2-methyl-acridine, 9-(2-pyridyl)-2-ethyl-acridine, 9-(3-pyridyl)-2-methyl-acridine, 9-(3-pyridyl)-2,4-diethyl-acridine, etc., and as particularly preferable compounds, there are exemplified 9-(3-pyridyl)acridine, 9-(4-pyridyl)acridine, and 9-(5-butyl-2-pyridyl)acridine.

The acridine derivative of this invention is, as described above, useful as a photopolymerization initaitor which is used for polymerizing an unsaturated compound by light irradiation. The unsaturated compound to be polymerized by use of the acridine derivative of this invention is a compound having at least one ethylenic double bond, and is a monomer which is addition-polymerized to be cured, by irradiation with actinic rays, giving a substantially insoluble cured product, or a polymer having ethylenic unsaturated double bonds in its side chain or main chain.

Such unsaturated compounds include, for example, unsaturated carboxylic acids such as acrylic acid, methacrylic acid, itaconic acid, crotonic acid, maleic acid, fumaric acid, and the like; esters of said unsaturated carbocylic acids and monohydric alcohols or polyhydric alcohols, or amides of said unsaturated carboxylic acids and monovalent or polyvalent amines; (meth)acrylates of polyhydroxy esters obtained from carboxylic acid having one or more hydroxyl groups and polyhydric alcohols; unsaturated polyesters and unsaturated polyamides which are obtained from unsaturated dicarboxylic acids (and other dicarboxylic acids) and polyhydric alcohols or polyvalent amines; urethane acrylates having terminal isocyanate obtained by the reactions of urethane compounds obtained from diisocyanates and polyhydric alcohols with hydroxyalkyl (meth)acrylates; epoxy acrylates obtained by the reactions of polyglycidyl ethers of bisphenols or polyols with (meth)acrylic acid; straight-chain polyesters obtained by the reactions of dicarboxylic acid anhydrides with glycidyl (meth)acrylate; and di(meth)acrylic acid modified polyesters or polyamides obtained by reacting polyesters or polyamides which have a carboxyl group at each end with glycidyl (meth)acrylate.

In these unsaturated compounds, the monohydric or polyhydric alcohols include, for example, methanol, ethanol, butanol, allyl alcohol, octanol, N,N-dimethyl ethanol, ethylene glycol, diethylene glycol, triethylene glycol, propylene glycol, neopentyl glycol, 1,3-butanediol, 1,4-butanediol, 1,6-hexanediol, glycerol, trimethylolpropane, trimethylolethane, tris(2-hydroxyethyl) isocyanurate, pentaerythritol, diglycerol, di-trimethylolpropane, and dipentaerythritol. The monovalent or polyvalent amines include, for example, ammonia, methylamine, butylamine, octylamine, diethylamine, dibutylamine, ethylenediamine, diethylenetriamine, morpholine, piperazine, and 1,6-hexamethylenediamine, and melamine. The carboxylic acids having two or more hydroxyl groups other than the unsaturated dicarboxylic acids include phthalic acid, isophthalic acid, terephthalic acid, trimellitic acid, pyromellitic acid, tetrahydrophthalic acid, succinic acid, adipic acid, and sebacic acid. The diisocyanates include toluene diisocyanate, diphenylmethane diisocyanate, hydrogenated diphenylmethane diisocyanate, isocyanatomethylcyclohexane isocyanate, hexamethylene diisocyanate, isophorone diisocyanate, etc.

Among the unsaturated compounds to be photopolymerized by use of the acridine derivative of this invention, specific examples of the unsaturated carboxylic acid esters or amides include, for instance, methyl-, ethyl-, butyl-, isooctyl-, 2-hydroxyethyl- or N,N-dimethylaminoethyl-acrylate; methyl- or ethyl-methacrylate; ethylene glycol diacrylate, triethylene glycol diacrylate, 1,4-butanediol acrylate, trimethylolpropane triacrylate, pentaerythritol triacrylate, pentaerythritol tetraacrylate, tris(2-acryloyloxyethyl) isocyanurate, dipentaerythritol-tetra-hexaacrylate, glycerol diacrylate, triethylene glycol dimethacrylate, trimethylolpropane trimethacrylate, pentaerythritol trimethacrylate, ethylene glycol dicrotonate, diallyl malate, bis(acryloyloxyethoxyphenyl)propane, acrylamide, methacrylamide, acrylic acid morpholide, ethylenebisacrylamide, hexamethylenebisacrylamide, and methylenebismethacrylamide.

As the unsaturated compound to be photopolymerized by use of the acridine derivative of this invention, there can also be exemplified, besides them, diallyl phthalate, diallyl malonate, divinyl adipate, divinyl phthalate, vinyl acetate, isobutyl vinyl ether, ethylene glycol divinyl ether, styrene, acrylonitrile, triallylisocyanurate, triallyl phosphate, etc.

Although the amount of the acridine derivative of this invention used as photopolymerization initiator is varied depending on the kind of the unsaturated compound used, said derivative is used usually preferably in the amount of 0.01 to 10 parts by weight per 100 parts by weight of the unsaturated compound.

When the acridine derivative of this invention is used as a photopolymerization initiator, its effect can be further enhanced by using various organic amine compounds or organic sulfur compounds together with said derivative.

The organic amine compounds include, for example, triethanolamine, triisopropanolamine, methyldiethanolamine, octyldiethanolamine, octadecyldiethanolamine, dibutylethanolamine, dioctylethanolamine, diethanolaniline, diethanolamine, methylethanolamine, butylethanolamine, tetrahydroxyethylethylenediamine, tetrahydroxyethylhexamethylenediamine, triethylamine, tributylamine, dimethylaminopropylamine, dimethylaniline, 4-dimethylaminotoluene, 4-diethylaminotoluene, 4-dimethylaminocyanobenzene, 4-diethylaminocyanobenzene, 4-dimethylaminobromobenzene, 4-diethylaminobromobenzene, 4-dimethylaminonitrobenzene, 4-diethylaminonitrobenzene, 4-dimethylaminobenzoic acid alkyl esters, 4-diethylaminobenzoic acid alkyl esters, 4-dimethylaminopyridine, 4-diethylaminopyridine, 4-pyrrolidinopyridine, phenylglycine, diethylaniline, diethylamine, dioctylamine, tetramethylethylenediamine, Michler's ketone, and anthranilic acid.

The organic sulfur compounds include 2-mercaptoimidazole, 2-mercaptooxazole, 2-mercaptothiazole, 2-mercaptobenzimidazole, 2-mercaptobenzoxazole, 6-chloro-2-mercaptobenzimidazole, 5-methylmercapto-1-phenyltetrazole, 6-methoxy-2-mercaptobenzimidazole, 2-mercaptonaphthoimidazole, 2-mercaptonaphthooxazole, 3-mercapto-1,2,4-triazole, etc.

Conventional additives such as thermopolymerization inhibitors, coloring agents, plasticizers, surface protecting agents, lubricating agents and the like may, if necessary, be included in the photopolymerizable composition containing the acridine derivative of this invention.

The above-mentioned thermopolymerization inhibitors include, for example, hydroquinone, p-methoxyphenol, pyrogallol, catechol, 2,6-di-tert-butyl-p-cresol, β-naphthol, and tert-butylhydroquinone.

the above-mentioned coloring agents include, for example, carbon black; metal powders such as silver powder, copper powder, aluminum powder, and the like; chrome yellow; extenders such as titanium dioxide, talc, alumina, and the like; inorganic pigments such as milori blue, chrome vermilion, and the like; organic pigments such as Hansa yellow, vulcan orange, permanent organe, lake red C, brilliant carmine B, rhodamine lake, esosine, phloxine, Victoria blue lake, phthalocyanine blue, phthalocyanine green, quinarcridone red, dioxazine violet, and the like; and dyes such as alkaliblue toner, methyl violet, and the like.

As described above, the acridine derivative according to this invention is widely used in photopolymerizable compositions containing various photopolymerizable monomers, polymers, etc., and gives a composition having a good photosensitivity particularly when used in a photopolymerizable composition comprising (1) 100 parts by weight of a compound which has a boiling point of 100° C. or higher at atmospheric pressure and has at least one kind of ethylenic unsaturated group, (2) 0 to 400 parts by weight of a thermoplastic organic polymer, and (3) 0.01 to 10 parts by weight of the acridine drivative of the general formula [I] according to this invention.

As the compound having a boiling point of 100° C. or higher at atmospheric pressure and at least one kind of ethylenic unsaturated group (component (1)) which is used in the photopolymerizable composition of this invention, there are exemplified, for example, compounds obtained by adding α, β-unsaturated carboxylic acids to polyhydric alcohols, such as tetraethylene glycol di(meth)acrylate (the term "di(meth)acrylate" means methacrylate or acrylate; hereinafter the same applied), polyethlene glycol di(meth)acrylate (having 2 to 14 ) ethylene groups), trimethylolpropane di(meth)acrylate, trimethylolpropane tri(meth)acrylate, tetramethylolmethane tri(meth)acrylate, tetramethylolmethane tetra(meth)acrylate, polypropylene glycol di(meth)acrylate (having 2 to 14 propylene groups), dipentaerythritol penta(meth)acrylate, dipentaerythritol hexa(meth)acrylate, and the like; compounds obtained by adding α, β-unsaturated carboxylic acids to glycidyl group containing compounds, such as trimethylolpropane triglycidyl ether triacrylate, bisphenol A diglycidyl ether diacrylate, and the like; esterified products obtained from carboxylic acids having two or more hydroxyl groups, e.g., phthalic anhydride and substances having a hydroxyl group and an ethylenic unsaturated group, e.g., β-hydroxyethyl (meth)acrylate; and alkyl ethers of acrylic acid or methacrylic acid, such as methyl (meth)acrylate, ethyl (meth)acrylate, butyl (meth)acrylate, 2-ethylhexyl (meth)acrylate, and the like.

As the thermoplastic organic polymer (component (2)), there are used, for example, copolymers of (meth)acrylic acid (this term means methacrylic acid or acrylic acid; hereinafter the same applied) alkyl esters and (meth)acrylic acid, and copolymers of (meth)acrylic acid alkyl esters, (meth)acrylic acid and vinyl monomers copolymerizable with them. The (meth)acrylic acid alkyl esters include, for example, methyl (meth)acrylate, ethyl (meth)acrylate, butyl (meth)acrylate, and 2-ethylhexyl (meth)acrylate. The vinyl monomers copolymerizable with the (meth)acrylic acid alkyl esters and (meth)acrylic acid include tetrahydrogurfuryl (meth)acrylate, dimethylethyl (meth)acrylate, diethyl (meth)acrylate, glycidyl methacrylate, 2,2,2-trifluoroethyl (meth)acrylate, 2,2,3,3-tetrafluoropropyl (meth)acrylate acrylamide, diacetone acrylamide, styrene, vinyltoluene, etc. As the thermoplastic organic polymer, homopolymers of the compounds described above can also be used. In addition thereto, there can also be used copolyesters such as polyesters of terephthalic acid, isophthalic acid and sebacic acid, and the like, copolymers of butadiene and acrylonitrile, cellulose acetate, cellulose acetate butyrate, methyl cellulose, ethyl cellulose, etc.

The blending amount of the thermoplastic organic polymer (2) is 0 to 400 parts by weight, preferably 20 to 250 parts by weight. Employment of the thermoplastic organic polymer improves the coating properties and the film strength of the resulting cured product. When said amount is more than 400 parts by weight, the photosensitivity is lowered because the amounts of the other components are relatively decreased. The weight average molecular weight of the thermoplastic organic polymer is preferably 10,000 or more from the viewpoint of the above-mentioned coating properties and film strength.

As a photopolymerization initiator, the substituted acridine derivative of the general formula [I] according to this invention is used, and when $R_1$, $R_2$, $R_3$, $R_4$, $R_5$, $R_6$, $R_7$ and $R_8$ are alkyl groups, they are preferably alkyl groups having 1 to 8 carbon atoms. The alkyl groups are optionally substituted by halogen atoms, alkoxy groups having 1 to 8 carbon atoms, etc. When the substituted acridine compound has a substituted aryl group, the substituent on the substituted aryl group is an alkyl group having 1 to 8 carbon atoms, an alkoxy group having 1 to 8 carbon atoms, a halogen atom, or the like. The six-membered heteroaromatic group for $Z_1$ in the above general formula [I] is preferably a pyridyl group, a pyrimidinyl group or a pyrazinyl group, which may have an alkyl substituent having 1 to 8 carbon atoms, and includes, for example, pyridyl group, 5-methylpyridyl group, 5-ethylpyridyl group, 5-butylpyridyl group, pyrimidinyl group, pyrazinyl group, and 5-methylpyrazinyl group.

Among the substituted acridine derivatives described above, 9-pyridylacridine compounds in which all of $R^1$, $R_2$, $R_3$, $R_4$, $R_5$, $R_6$, $R_7$ and $R_8$ are hydrogen atoms and $Z_1$ is a pyridyl group, are preferred, and there are exemplified, for example, 9-(2-pyridyl)acridine, 9-(3-pyridyl)acridine, 9-(4-pyridyl)acridine, 9-(4-pyrimidinyl)acridine, 9-(2-pyradinyl)acridine, 9-(5-methyl-2-pyradinyl)acridine, 9-(2-quinolinyl)acridine, 9-(2-pyridyl)-2-methyl-acridine, 9-(2-pyridyl)-2-ethylacridine, 9-(3-pyridyl)-2-methyl-acridine, and 9-(3-pyridyl)-2,4-diethyl-acridine. Among them, particularly preferable compounds are 9-(3-pyridyl)acridine, 9-(4-pyridyl)acridine, and 9-(5-butyl-2-pyridyl)acridine.

The photopolymerization initiator (component (3)) of this invention is used in an amount of 0.01 to 10 parts by weight, preferably 0.1 to 5 parts by weight. When the amount is less than 0.01 part by weight, no sufficient photosensitivity can be attained, so that the progress of photopolymerization is insufficient, while when the amount exceeds 10 parts by weight, the photopolymerizable composition has a low storage stability and cannot be put to practical use.

The photopolymerization initiators (component (3)) in this invention may be used in combination of two or more thereof, and may be used together with the previously exemplified organic amine compounds and organic sulfur compounds, etc.

Thermopolymerization inhibitors such as p-methoxyphenol, hydroquinone, pyrogallol, naphthylamine, phenothiazine, t-butylcatechol, and the like can be included in the photopolymerizable composition of this invention.

Coloring agents such as dyes, pigments, and the like may be included in the photopolymerizable composition of this invention. As the coloring agents, there are used, for example, fuchsine, auramine base, crystal violet, Victoria pure blue, malachite green, methyl orange, and acid violet RRH.

Furthermore, well-known additives such as plasticizers, adhesion accelerator, talc, and the like may also be added to the photopolymerizable composition of this invention, and combinations of halides such as carbon tetrabromide and leuco dyes may also be added so as to cause a color change of an exposed portion.

The photopolymerizable composition of this invention is used as a solvent-containing, solution-form photopolymerizable composition prepared by dissolving and mixing the above-mentioned components by use of a solvent capable of dissolving them, such as acetone, methyl ethyl ketone, methyl isobutyl ketone, methyl Cellosolve, ethyl Cellosolve, chloroform, methylene chloride, methyl alcohol, ethyl alcohol, or the like, or as a solvent-free, solution-form photopolymerizable composition prepared by dissolving the components other than the above-mentioned component (1), a compound having the ethylenical unsaturation in the compound without using the solvents described above.

These forms of the composition may be directly applied to a substrate such as a steel plate by use of roll coaters, curtain coaters or well-known procedures such as various printings, immersion, etc., or it may be once applied to a support such as a film which is then applied to a base after a solvent, if contained, is removed. The application method is not critical.

The photopolymerizable composition of this invention can be used for various purposes, for example, it can be used as photo-setting coating materials, photo-setting inks, photosensitive pring plates, photoresists, etc., and its application purposes are not critical. For example, as a photoresist for printed circuit board, said composition can be used by coating the above-mentioned solution-form photopolymerizable composition on a substrate such as a steel plate, drying the composition when it contains a solvent, and then exposing the composition to actinic rays to light-cure the same. Furthermore, said composition can be used by coating the above-mentioned solution-form photopolymerizable composition on a polyethylene terephthalate film, drying the composition when it contains a solvent, thereafter laminating the film on a substrate, and light-curing the composition.

As a light source of the actinic rays used for the light-curing, there are used those which emit light having a wavelength of 300 to 450 nm, and for example, mercury vapor arc, carbon arc, and xenon arc lamps are preferred.

This invention is further illustrated below in more detail with reference to Examples.

EXAMPLE 1

Synthesis of 9-(3-pyridyl)acridine

273 Grams (1.62 moles) of diphenylamine, 100 g (0.81 mole) of nicotinic acid and 1400 g of polyphosphoric acid were mixed, and then stirred under a nitrogen gas stream at 205° to 240° C. for 4 hours. After cooling, the mixture was poured onto crushed ice and 8 liters of water was added. The aqueous layer was separated and the insoluble materials were removed therefrom by filtration, after which the residue was adjusted to pH 10 by addition of a 50% aqueous potassium hydroxide solution. The oily substance formed was extracted therefrom with 2 liters of chloroform, washed sufficiently with water, and then dried over anhydrous sodium sulfate. After the chloroform was removed by distillation, recrystallization the residue from ethanol was conducted to obtain a product in the form of light-yellowish-brown powder which had a melting point of 204°-207° C.

Elementary analysis results for the product were as follows and were in good agreement with those for the desired compound:

|  | C % | H % | N % |
|---|---|---|---|
| Found | 84.58 | 4.63 | 10.79 |
| Calculated | 84.35 | 4.72 | 10.93 |

As a result of infrared spectroscopic analysis, characteristic absorptions appeared at 3050, 1410, 760 and 720 cm$^{-1}$, and the product was identified as the desired compound.

The measurement results of ultraviolet absorption spectrum of the compound obtained are shown below:

$\lambda_{max}$ = 359 nm, $\epsilon$ = 9.98 × 10$^3$

EXAMPLE 2

Synthesis of 9-(4-pyridyl)acridine

The above compound in the form of light-yellowish-brown powder having a melting point of 195°-205° C. was synthesized by the same procedure as in Example 1, except that pyridine-4-carboxylic acid was used in place of nicotinic acid.

Elementary analysis results for the product were as follows and were in good agreement with those for the desired product:

|  | C % | H % | N % |
|---|---|---|---|
| Found | 84.66 | 4.59 | 10.75 |
| Calculated | 84.35 | 4.72 | 10.92 |

As a result of infrared spectroscopic analysis, absorptions appeared at 3050, 1600, 760 and 750 cm$^{-1}$, and the product was identified as the desired compound.

The measurement results of ultraviolet absorption spectrum of the compound obtained are shown below:

$\lambda_{max}$ = 359 nm, $\epsilon$ = 8.86 × 10$^3$

EXAMPLE 3

Synthesis of 9-(2-pyridyl)acridin

The above compound in the form of light-purple powder having a melting point of 192°-205° C. was synthesized by the same procedure as in Example 1, except that pyridine-2-carboxylic acid was used in place of nicotinic acid.

The effects of the acridine derivatives of this invention as a photopolymerization initiators are further explained below in more detail with reference to Application Examples.

APPLICATION EXAMPLE 1

| [Recipe] | parts by weight |
|---|---|
| Epoxy acrylate (molecular weight: 1500) (NK ester U-108A, mfd. by Shin-Nakamura Chemical Co., Ltd. | 80 |
| 1,6-Hexanediol diacrylate | 20 |
| Cyanine blue (SR-5020, mfd. by Dainichi Seika Color & Chemicals Mfg. Co., Ltd. | 22 |
| Acridine derivative of the invention | 0.12 |
| Adjuvant co-used | Shown in Table 1 respectively |

The above ingredients were sufficiently kneaded together and coated on a sheet of paper uniformly to a thickness of 10 μm by means of a bar coater. The coating was transferred to another sheet of paper by use of a rubber roller.

The paper having the coating transferred thereto was passed under a high pressure mercury arc lamp (H-400P, mfd. by Toshiba Corp.) at a conveyor speed of 20 m/min under the conditions of an output of lamp of 160 W/cm and an irradiation distance of 10 cm, and the number of passages required for the coating to become tack-free was investigated. The results obtained are shown in Table 1.

TABLE 1

| No. | Photopolymerization initiator | Agent co-used | Parts by weight | Number of passages required for curing |
|---|---|---|---|---|
| 1 | 9-Phenylacridine | 2-Mercaptoimidazole | 0.18 | 5 times |
| 2 | 9-(3-Pyridyl)acridine | 2-Mercaptoimidazole | 0.18 | 2 |
| 3 | 9-(3-Pyridyl)acridine | 2-Mercaptoimidazole | 0.36 | 1 |
| 4 | 9-(3-Pyridyl)acridine | Methyl 4-diethylamino-benzoate | 2 | 2 |
| 5 | 9-(3-Pyridyl)acridine | Methyl 4-diethylamino-benzoate | 4 | 1 |
| 6 | 9-(4-Pyridyl)acridine | 2-Mercaptoimidazole | 0.18 | 2 |
| 7 | 9-(4-pyridyl)acridine | Methyl 4-diethylamino-benzoate | 2 | 2 |

In the table, No. 1 shows a comparative example and Nos. 2 to 7 show the cases where the acridine derivatives of this invention were used.

APPLICATION EXAMPLE 2

| [Recipe] | parts by weight |
|---|---|
| Urethane acrylate (molecular weight: 1500) (NK ester U-1080, mfd. by Shin-Nakamura Chemical Co., Ltd. | 80 |
| Trimethylolpropane triacrylate (NK ester A-TMPT, mfd. by Shin-Nakamura Chemical Co., | 20 |

-continued

| [Recipe] | parts by weight |
|---|---|
| Ltd. | |
| Sample compound | 0.12 |
| Adjuvant co-used | Table 2 |

The above ingredients were sufficiently kneaded together and then coated on a glass plate uniformly to a thickness of 20 μm by means of a doctor knife. The glass plate was exposed to light of 50 mJ from a high pressure mercury arc lamp.

Dumbbell specimens No. 2 according to JIS K-7113 were cut out of the coating and subjected to a tension test by means of a STM-H-500 tester mfd. by TOYO GOLDFIN Co., Ltd., after which the Young's modulus at the time of 50% elongation was calculated, whereby the cured state of the coating was investigated.

The results obtained are shown in Table 2. In the table, the larger Young's modulus means more curing.

TABLE 2

| No. | Photopolymerization initiator | Agent co-used | Parts by weight | Young's modulus (dyn/cm$^2$) |
|---|---|---|---|---|
| 8 | 9-Phenylacridine | None | — | 220 |
| 9 | 9-Phenylacridine | 2-Mercaptoimidazole | 0.18 | 350 |
| 10 | 9-(3-Pyridyl)acridine | None | — | 405 |
| 11 | 9-(3-Pyridyl)acridine | 2-Mercaptoimidazole | 0.18 | 620 |
| 12 | 9-(3-Pyridyl)acridine | Methyl 4-diethylamino-benzoate | 2 | 550 |
| 13 | 9-(4-Pyridyl)acridine | 2-Mercaptoimidazole | 0.18 | 615 |
| 14 | 9-(4-pyridyl)acridine | Methyl 4-diethylamino-benzoate | 2 | 540 |

Note:
In the table, Nos. 8 and 9 show comparative examples and Nos. 10 to 14 shows the case where the acridine derivatives of this invention were used.

As shown in Table 1 and Table 2, it is clear that the acridine derivatives of this invention are more effective as photopolymerization initiators than 9-phenylacridine which has heretofore been well known.

EXAMPLES 4 AND 5 AND COMPARATIVE EXAMPLE 1

A solution A was obtained by blending 400 g of tetraethylene glycol diacrylate, 2 g of malachite green, 100 g of barium sulfate, 10 g of methyl alcohol, and 30 g of dimethylformamide. Photopolymerization initiators were dissolved in the solution A in the respective blending amounts shown in Table 3, whereby solutions as the photopolymerizable compositions of this invention were obtained (Examples 4 and 5).

Subsequently, each of these solutions was coated on a steel plate by use of an applicator and dried at 100° C. for 10 minutes in a hot air dryer. The coating thickness was about 20 μm. Then, the steel plate was passed 20 cm under a 7-KW high pressure mercury arc lamp at a conveyer speed of 3 m/min, and the number of passages required for the surface to become tack-free was investigated. The results obtained are shown in Table 1. The smaller number of passages means the higher photosensitivity. For comparison, the number of passages required for curing was investigated also for a composition (Comparative Example 1) using none of the photopolymerization initiators used in the photopolymerizable compositions of this invention, by the same manner as described above. The result obtained is also shown in Table 3 (benxophenone and Michler's ketone were used as photopolymerization initiators).

TABLE 3

| | | Example 4 | Example 5 | Comparative Example 1 |
|---|---|---|---|---|
| Composition | Solution A (g) | 100 | 100 | 100 |
| | 9-(3-pyridyl)-acridine (g) | 0.5 | 0.5 | — |
| | Methyl 4-diethyl-aminobenzoate (g) | — | 4 | — |
| | Benzophenone (g) | — | —. | 3 |
| | Michler's ketone (g) | — | — | 0.1 |
| Number of passages required for curing | | 2 | 1 | 4 |

The results shown in Table 3 indicate that the photopolymerizable compositions according to this invention have a high photosensitivity.

EXAMPLES 6 TO 15 AND COMPARATIVE EXAMPLE 2

| [Recipe] | parts by weight |
|---|---|
| Epoxy acrylate (molecular weight: 1500) (NK ester U-108A, mfd. by Shin-Nakamura Chemical Co., Ltd. | 80 |
| 1,6-Hexanediol diacrylate | 20 |
| Cyanine blue (SR-5020, mfd. by Dainichi Seika Color & Chemicals Mfg. Co., Ltd. | 22 |
| Each photopolymerization initiator listed in Table 4 | 0.12 |
| Each agent co-used listed in Table 4 | Amount shown in Table 4 |

The above ingredients were sufficiently kneaded together and then coated on a sheet of paper uniformly to a thickness of 10 μm by means of a bar coater. The coating was transferred to another sheet of paper by use of a rubber roller.

The paper having the coating transferred thereto was passed under a high pressure mercury arc lamp (H-400P, mfd. by Toshiba Corp.) at a conveyor speed of 20 m/min under the conditions of an output of lamp of 160

W/cm and an irradiation distance of 10 cm, and the number of passages required for the coating to become tack-free was investigated. The results obtained are shown in Table 4.

and the above-mentioned photopolymerizable element was laminated on the copper surface with heating at 120° C.

Then, the substrate thus obtained was exposed to light from a 3-KW high pressure mercury arc lamp (Pheonix-3000, mfd. by Orc Manufacturing Co., Ltd.) at 40 mJ/cm$^2$ by use of a negative. In this case, in order that the photosensitivity could be evaluated, there was used a negative which had been produced so as to reduce the degree of light transmittance stepwise (a step tablet in which the optical density was increased by 0.15 every step from 0.05, the optical density of the first step).

Subsequently, the polyethylene terephthalate film was removed and the non-exposed portion was removed by spraying a 2% aqueous sodium carbonate solution at 30° C. for 50 seconds. Then, the photosensitivity of the photopolymerizable composition was evaluated by measuring the number of steps of step tablet of the light-cured film formed on the copper-clad laminate board. The larger number of steps of this step tablet means the higher photosensitivity.

The results shown in Table 5 indicate that the photopolymerizable compositions of this invention have a high photosensitivity.

TABLE 4

|   | Photopolymerization initiator | Agent co-used | (parts by weight) | Number of passages required for curing (times) |
| --- | --- | --- | --- | --- |
| Comparative Example 2 | 9-Phenylacridine | 2-Mercaptoimidazole | (0.18) | 5 |
| Example 6 | 9-(3-Pyridyl)acridine | 2-Mercaptoimidazole | (0.18) | 2 |
| Example 7 | 9-(3-Pyridyl)acridine | 2-Mercaptoimidazole | (0.36) | 1 |
| Example 8 | 9-(3-Pyridyl)acridine | Methyl 4-diethylaminobenzoate | (2) | 2 |
| Example 9 | 9-(3-Pyridyl)acridine | Methyl 4-diethylaminobenzoate | (4) | 1 |
| Example 10 | 9-(4-Pyridyl)acridine | 2-Mercaptoimidazole | (0.18) | 2 |
| Example 11 | 9-(4-pyridyl)acridine | Methyl 4-diethylaminobenzoate | (2) | 2 |
| Example 12 | 9-(2-Pyridyl)acridine | 2-Mercaptoimidazole | (0.18) | 2 |
| Example 13 | 9-(5-Butyl-2-pyridyl)-acridine | 2-Mercaptoimidazole | (0.18) | 2 |
| Example 14 | 9-(2-Pyrazinyl)acridine | 2-Mercaptoimidazole | (0.18) | 2 |
| Example 15 | 9-(2-Quinolinyl)acridine | 2-Mercaptoimidazole | (0.18) | 3 |

EXAMPLES 16 TO 19 AND COMPARATIVE EXAMPLES 3 TO 5

248.8 Grams (total nonvolatile content: 93.8 g) of a solution B was obtained by blending 52 g of a methyl methacrylate/methacrylic acid/2-ethylhexyl acrylate (60/20/20 by weight) copolymer (weight average molecular weight ≈ 80,000), 10 g of tetraethylene glycol diacrylate, 30 g of dimethacrylate of poly(P ≈ 5)-oxyethylenated bisphenol A (BPE-10, mfd. by Shin-Nakamura Chemical Co., Ltd.), 0.2 g of malachite green, 0.1 g of hydroquinone, 1.0 g of leuco crystal violet, 0.5 g of carbon tetrabromide, 10 g of toluene, 130 g of methyl Cellosolve, 5 g of methyl alcohol, and 10 g of chloroform. Photopolymerization initiators were dissolved in the solution B in their respective blending proportions shown in Table 5, whereby solutions as the photopolymerizable compositions of this invention were obtained.

Subsequently, each of these solutions was coated uniformly on a polyethylene terephthalate film of 25 μm in thickness and dried in a hot air convection dryer at 100° C. for about 5 minutes to obtain a photopolymerizable element. The coating thickness of the photopolymerizable composition after the drying was 25 μm.

On the other hand, the copper surface of a copper-clad laminate board (MCL-E-61, mfd. by Hitachi Kasei Co., Ltd.) which was a glass-epoxy laminate having copper foils (35 μm in thickness) laminated on both sides was polished with sandpaper #800, washed with water, and dried in air stream, after which the copper-clad laminate board thus obtained was heated at 60° C.,

TABLE 5

|   |   | Comparative Example 3 | Comparative Example 4 | Comparative Example 5 | Example 16 | Example 17 | Example 18 | Example 19 |
| --- | --- | --- | --- | --- | --- | --- | --- | --- |
| Composition | Solution B (g) | 248.8 | 248.8 | 248.8 | 248.8 | 248.8 | 248.8 | 248.8 |
|   | Benzophenone (g) | 4 | 6 | 8 | — | — | — | — |
|   | Michler's ketone (g) | 0.2 | 0.2 | 0.2 | — | — | — | — |
|   | 9-(3-Pyridyl)-acridine (g) | — | — | — | 0.7 | 1.0 | 1.5 | 0.7 |
|   | Methyl 4-diethyl-aminobenzoate (g) | — | — | — | — | — | — | 4 |
| Number of steps of step tablet |   | 3 | 4 | 4 | 8 | 10 | 11 | 10 |

INDUSTRIAL APPLICABILITY

The substituted acridine derivatives and the photopolymerizable compositions containing the same of this invention are suitably applicable for purposes for which a high photosensitivity is required.

We claim:
1. A photopolymerizable composition comprising
   (1) 100 parts by weight of a photopolymerizable compound which has a boiling point of 100° C. or higher at atmospheric pressure and has at least one kind of ethylenic unsaturated group,
(2) 0 to 400 parts by weight of a thermoplastic organic polymer, and
(3) 0.01 to 10 parts by weight of a substituted acridine derivative represented by the general formula [I]:

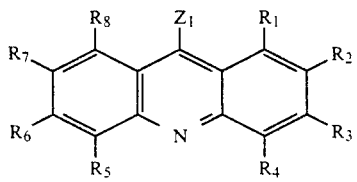

wherein $R_1$, $R_2$, $R_3$, $R_4$, $R_5$, $R_6$, $R_7$ and $R_8$ are independently hydrogen atoms, alkyl groups having 1 to 8 carbon atoms, alkyl groups having 1 to 8 carbon atoms and being substituted with halogen atoms or alkoxy groups having 1 to 8 carbon atoms, halogen atoms, or alkoxy groups having 1 to 8 carbon atoms, and $Z_1$ is a six-membered heteroaromatic group which has one or two nitrogen atoms in its ring and may have an alkyl substituent having 1 to 8 carbon atoms, or a quinolyl group.

2. A photopolymerizable composition according to claim 1, wherein the photopolymerization initiator is such that in general formula [I], $Z_1$ is a pyridyl group, a pyrimidinyl group or a pyrazinyl group, which may have an alkyl substituent having 1 to 8 carbon atoms.

3. A photopolymerizable composition according to claim 1, wherein the photopolymerization initiator is a 9-pyridylacridine compound represented by the following formula:

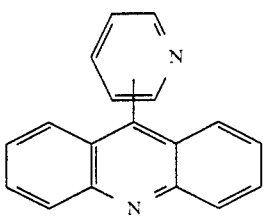

* * * * *